United States Patent [19]

Hollister et al.

[11] Patent Number: 4,739,277

[45] Date of Patent: Apr. 19, 1988

[54] TRIGGERED, PROGRAMMABLE SKEW SIGNAL GENERATOR

[75] Inventors: Allen L. Hollister, Beaverton; Philip S. Crosby, Portland, both of Oreg.

[73] Assignee: Tektronix, Inc., Beaverton, Oreg.

[21] Appl. No.: 835,412

[22] Filed: Mar. 3, 1986

[51] Int. Cl.[4] ............................................. H03K 5/15
[52] U.S. Cl. ................................... 328/55; 328/63; 328/155; 307/262
[58] Field of Search ............... 307/262, 269, 271, 511, 307/512; 328/63, 55, 72, 140, 155, 133, 165, 104, 109; 371/1; 375/107, 111, 118

[56] References Cited

U.S. PATENT DOCUMENTS

| | | | |
|---|---|---|---|
| 3,602,824 | 8/1971 | Rusch | 307/271 |
| 3,746,997 | 7/1973 | Willett et al. | 328/140 |
| 3,971,996 | 7/1976 | Motley et al. | 328/155 |
| 4,379,264 | 4/1983 | Lenhardt | 328/155 |
| 4,485,479 | 11/1984 | Iino et al. | 328/55 |
| 4,646,297 | 2/1987 | Palmquist et al. | 328/55 |
| 4,703,448 | 10/1987 | Muething, Jr. | 307/525 |

*Primary Examiner*—Stanley D. Miller
*Assistant Examiner*—Timothy P. Callahan
*Attorney, Agent, or Firm*—George T. Noe; Daniel J. Bedell

[57] ABSTRACT

A signal generator for producing a triggered output signal of digitally controlled phase and frequency includes a skewing circuit for producing an output clock signal of the same period, T, as an input, triggered reference clock signal but which is phase skewed from the reference clock signal by a phase angle, P, of 0 to 360 degrees as determined by input digital data. The skewed clock signal is frequency divided by an integer factor N, and a timing circuit counts reference clock periods to initiate frequency division a programmable delay time (J×T seconds) following triggering of the reference clock signal, where J and N are integers also determined by input digital data. An AND gate qualifies the frequency divided skewed clock signal with the skewed clock signal itself to produce a periodic output signal of digitally controlled frequency N/T, the first pulse of which is delayed following triggering of the reference signal by a digitally controlled interval of (T×J)+(P×T/360) seconds.

19 Claims, 5 Drawing Sheets

TRIGGERED, PROGRAMMABLE SKEW SIGNAL GENERATOR

BACKGROUND OF THE INVENTION

The present invention relates in general to signal generators and more particularly to an apparatus for generating a periodic signal of adjustable frequency commencing an adjustable time following a triggering signal.

Sampling oscilloscopes were developed more than twenty years ago to observe small, fastchanging signals to which conventional oscilloscopes could not respond due to limited bandwidth or risetime characteristics. Sampling is a now well-known technique wherein a signal path is gated for an extremely short period of time to pass the substantially instantaneous amplitude value (voltage sample) of an electrical signal during that period. Each sample taken in this manner is processed by electronic circuits and displayed as a dot on a cathode-ray tube (CRT) screen at an appropriate position corresponding to the relative timing and magnitude of the sample. Since the samples appear on the CRT display as dots, a large number of samples are required to accurately reconstruct a waveform. Generally speaking, sampling is most practical when the electrical signal is repetitive in nature since it is impossible to acquire all of the needed samples during a single cycle of all but relatively low frequency signals. Indeed, one of the advantages of sampling is that at least one sample can be acquired from each of a large number of cycles of a high frequency signal, and a representative waveform may be reconstructed and displayed therefrom.

Sampling modes are typified in accordance with the timing method used. Sequential sampling is a mode in which a waveform display is comprised of an orderly series of equally spaced dots. Random sampling is a mode in which successive dots may occur at what appear to be random horizontal positions because the sample timing and signal triggering are unrelated, although it must be pointed out that with random sampling the reconstructed waveform is defined because the dots are inserted into the display at substantially correct time positions.

Random sampling systems of the prior art have been adapted for sampling high frequency, repetitive waveforms by sampling a waveform at random points along several repetitive sections of the waveform. The resulting waveform display is then formed by ordering and graphically displaying sample data according to the relative sample time of each sample with respect to a triggering event, such as a zero crossing, occurring at the same point within each waveform section. The data acquired by this "equivalent time" method of sampling characterizes the waveform with a resolution equivalent to that which would be obtained if only a single section of the waveform were sampled at a much higher sampling rate. However since the sample timing is random, more samples must be taken to obtain a minimum resolution than would be required for periodic sampling.

In order for sequential sampling to be used for equivalent time sampling, the sampling times for each successive waveform section would have to be progressively skewed by a controlled phase angle with respect to a repetitive triggering event in a waveform to be sampled. Sequential sampling systems of the prior art sample waveforms periodically but are not adapted for equivalent time sampling because while the frequency of sampling timing can be precisely controlled, the point at which sampling begins during a waveform cannot be. In a sequential sampling system, sampling timing is typically controlled by a strobe generator which produces strobe signals for initiating sampling in response to a periodic input signal. What is needed is an apparatus for producing a periodic signal of adjustable frequency wherein the timing of the first cycle of the periodic signal with respect to a triggering signal can be accurately controlled with respect to a triggering signal.

SUMMARY OF THE INVENTION

In accordance with one aspect of the invention, a triggered, programmable skew signal generator includes a skewing circuit for producing a skewed clock signal output of the same period, T, as a high frequency, triggered reference clock signal, but which is phase skewed from the reference clock signal by a finely adjustable phase angle, P, ranging from 0 to 360 degrees. The skewed clock signal is frequency divided by a programmable divide-by-N counter which is count enabled by an enabling signal produced by a programmable timing circuit after detection of the triggering signal which triggered the reference clock signal. When the angle, P, is less than 180 degrees, the enabling signal is produced on the first skewed clock signal cycle occurring after a time interval of $J \times T$ seconds following the triggering signal "J" is an integer of adjustable magnitude. When the angle P is greater than 180 degrees, the time interval is increased by T/2 seconds. The skewed clock signal and the output of the divide-by-N counter are applied as inputs to an AND gate which produces a periodic square wave output signal of frequency N/T, the first pulse of which is skewed from the triggering signal by $(T \times J) + (P \times T/360)$ seconds. Since the magnitudes of N, J, and P are adjustable, and since T is constant and small, the programmable skew signal generator of the present invention permits accurate adjustment of both the frequency of the square wave output signal and of starting time of the output signal with respect to the triggering signal. The signal generator of the present invention is particularly suitable for use for controlling sample timing in a waveform sampling system.

In accordance with another aspect of the invention, the skewing circuit includes a random access memory, addressed by control data representing a desired phase angle, for storing at each address, corresponding to a phase angle, first data of magnitude proportional to the absolute value of the cosine of the corresponding phase angle and second data of magnitude proportional to the absolute value of the sine of the corresponding phase angle. The memory also stores at each address data indicating the quadrant (i.e., 0–90, 20–180, 180–270 or 270–360 degrees) bounding the corresponding phase angle. When the memory is addressed by phase angle data indicating a desired phase angle, P, the addressed first and second data are transmitted to digital to analog converters which produce first and second currents of magnitude proportional to the absolute value of the cosine and sine of P respectively. A first multiplexing circuit controlled by the reference clock signal modulates the first current to produce first and second square wave current signals of peak magnitude proportional to the cosine of P, the first square wave signal being in phase with the reference clock signal and the second square wave signal being 180 degrees out of phase with the reference clock signal. The reference signal, delayed by one fourth of its period, also controls a second multiplexing circuit which modulates the second current to produce third and fourth square wave current signals of peak magnitude proportional to the sine of P, the third square wave signal lagging the reference signal by 90 degrees and the fourth signal lagging the reference signal by 270 degrees. A selected pair of the first, second, third and fourth square wave current signals are summed to produce a fifth current signal, the selection being made according to the data output of the memory indicating the quadrant of the phase angle P. The fifth current is filtered to develop a sine wave voltage, and this voltage is applied to a first input to a comparator, a second input of which is grounded. In response to the sine wave voltage, the comparator produces a square wave clock signal which lags the reference clock signal by the desired phase angle.

In accordance with a further aspect of the invention, the timing circuit includes a counter for counting reference clock periods following the triggering signal and for generating an output signal upon counting J reference clock periods, where J is an integer determined according to the magnitude of applied digital control data. The counter output signal is applied as a first input to a multiplexer and is also delayed for one half of the period T of the reference clock signal and applied as a second input to the multiplexer, the switching state of the multiplexer being controlled by the phase angle quadrant indicating data produced by the memory. The output of the multiplexer drives a latch input, and the latch is clocked by the phase shifted clock signal such that the latch produces the enabling signal as its output when set. The enabling signal is therefore produced on the first skewed clock signal pulse occurring after J×T seconds (or J×T+T/2 seconds, if the desired phase angle exceeds 180 degrees) following the triggering signal.

It is accordingly an object of the invention to provide an improved apparatus for producing a periodic output signal of adjustable frequency commencing an adjustable time following occurrence of a triggering signal.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

Figure 1:
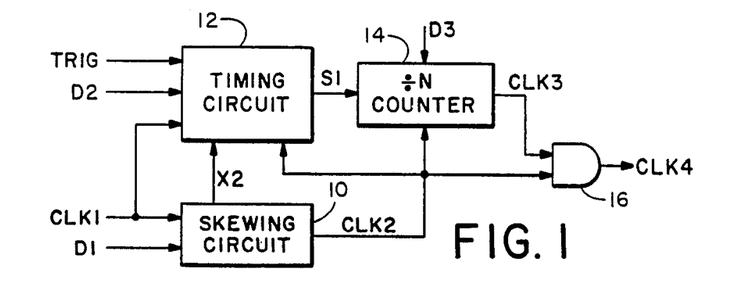
FIG. 1 is a block diagram of the triggered, programmable skew signal generator according to the present invention.

Referring to FIG. 1 a triggered, programmable skew generator according to the present invention, depicted in block diagram form, comprises a skewing circuit 10, a timing circuit 12, a divide-by-N counter 14 and an AND gate 16. The skewing circuit 10 generates a square wave output signal CLK2 which is of the same frequency (e.g., 100 MHz) as a triggered, square wave reference clock signal CLK1 applied as input to the skewing circuit. While CLK1 and CLK2 are of the same frequency, the skewing circuit output signal CLK2 lags CLK1 by a phase angle P ranging from 0 to 360 degrees as determined by an externally generated phase angle data D1 input to the skewing circuit 10.

The reference signal CLK1 is also applied as an input to the timing circuit 12 along with the CLK2 signal and an externally generated triggering signal TRIG, the same triggering signal which initiated the triggered reference clock signal CLK1 and which triggering signal therefore coincides with the leading edge of the first pulse of the CLK1 signal. Timing circuit 12 produces an enabling signal S1 on the leading edge of the first CLK2 pulse occurring after the end of a predetermined time interval I following the triggering signal. The duration of this time interval I is determined according to externally generated timing data D2 and according to the state of a binary control signal X2 produced by the skewing circuit 10. Signal X2 indicates whether the phase angle P indicated by data D1 is larger or smaller than 180 degrees and data D2 indicates a time (T×J) in terms of an integer number J of reference clock CLK1 periods of duration T. Timing circuit 12 adjusts the time interval I to J×T seconds or to (J×T)+(T/2) seconds, where T is the time in seconds of one period of the reference clock signal CLK1. The T/2 second term is added to the interval I when the X2 signal indicates that the phase angle P between CLK1 and CLK2 is to exceed 180 degrees.

The enabling signal S1 output of the timing circuit 12 count enables the divide-by-N counter 14 which counts pulses of the clock signal CLK2 output of the skewing circuit 10. Counter 14 produces an output pulse of duration T seconds when count enabled and thereafter produces an additional output pulse of duration T seconds each time it counts N subsequent pulses of clock signal CLK2, where N is determined according to externally generated control data D3 applied to counter 14. For example, in an application where the clock signal CLK2 has a 100 MHz frequency, and a 20 MHz skew signal generator output signal is required, N is set to 5 such that the frequency of the output signal CLK3 produced by the divide-by-N counter 14 is 20 MHz. The signals CLK2 and CLK3 are applied as inputs to the AND gate 16 which produces the 20 MHz output clock signal CLK4 of the skew signal generator.

Figure 2:
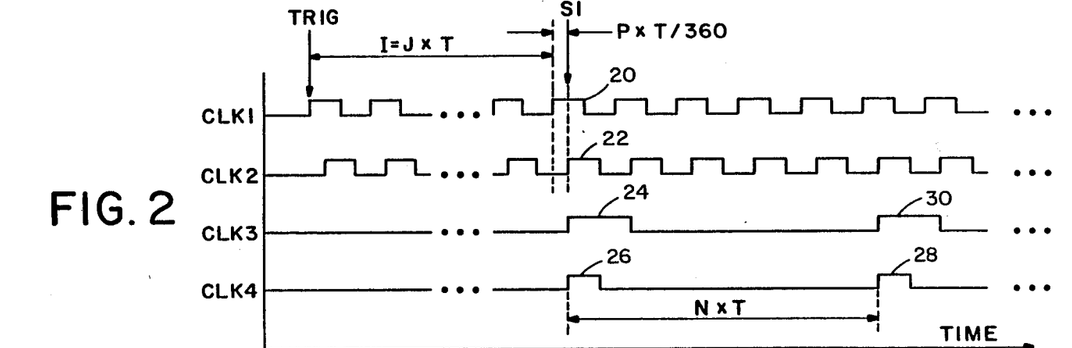
FIG. 2 is a timing diagram illustrating a first example of the operation of the programmable skew signal generator of FIG. 1.

The timing relationships between CLK1, CLK2, CLK3 and CLK4, when the phase angle P between CLK1 and CLK2 is less than 180 degrees, are illustrated in the timing diagram of FIG. 2. When the phase angle P between CLK1 and CLK2 is less than 180 degrees, the X2 signal is of a state wherein the additional T/2 seconds are not included in the time interval I following the triggering signal TRIG as determined by the timing circuit 12. Since the enabling signal S1 occurs on the leading edge of first CLK2 pulse (pulse 22) after the end of interval I, the time between TRIG and S1 is therefore $J \times T$ seconds plus an additional amount of time ($P \times T/360$ seconds) due to the phase angle P between the leading edge of the Jth CLK1 pulse 20 and the corresponding CLK2 pulse 22. The CLK2 pulse 22 causes the divide-by-N circuit to initiate the first CLK3 pulse 24. The AND gate 16 of FIG. 1 then combines this CLK2 pulse 22 and the CLK3 pulse 24 to produce the first CLK4 pulse 26. The next CLK4 pulse 28 is produced N cycles of the CLK2 signal later, coincident with the next CLK3 pulse 30. Thus the first CLK4 pulse 26 occurs $(J \times T)+(P \times T/360)$ seconds after the triggering signal TRIG and subsequent CLK4 pulses occur every $N \times T$ seconds thereafter.

Figure 3:
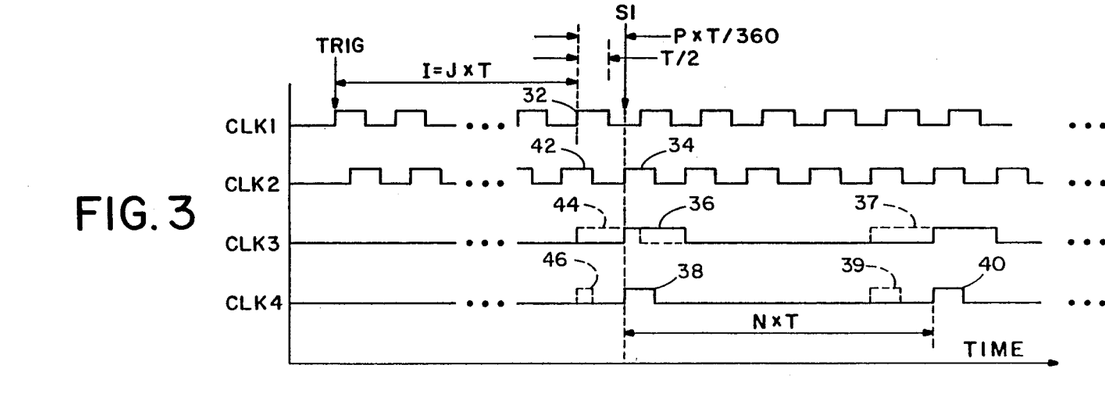
FIG. 3 is a timing diagram illustrating a second example of the operation of the programmable skew signal generator of FIG. 1.

The timing relationships between CLK1, CLK2, CLK3 and CLK4 when the phase angle P between CLK1 and CLK2 is greater than 180 degrees are illustrated in the timing diagram of FIG. 3. When the phase angle P between CLK1 and CLK2 is greater than 180 degrees the state of signal X2 is set such that the time interval I following the triggering signal TRIG is set to $(T \times J)+(T/2)$ seconds. The enabling signal S1 thus occurs on the leading edge of the next CLK2 pulse 34, or $(P \times T/360)+(T/2)$ seconds after the end of interval I. This CLK2 pulse 34 causes the divide-by-N circuit to initiate the first CLK3 pulse 36 which AND gate 16 combines with CLK2 pulse 34 to form the first CLK4 pulse 38. The next CLK4 pulse 40 is produced $N \times T$ seconds later. Thus, as in the case when P is less than 180 degrees, the first CLK4 pulse 38 also occurs $J \times T + P \times T/360$ seconds after the triggering signal T and subsequent CLK4 pulses occur every $N \times T$ seconds thereafter. The extra half reference clock cycle $T/2$ is introduced into interval I when the phase angle between CLK1 and CLK2 is greater than 180 degrees because without the extra half cycle delay, the CLK2 pulse 42 preceding pulse 34 would prematurely enable the divide-by-N counter which would prematurely generate a first CLK3 pulse 44 (shown in dotted line) and which would in turn cause the AND gate to produce a first CLK4 pulse 46 (also shown in dotted line) of variable duration. Since the divide-by-N counter would start its count prematurely, subsequent CLK3 and CLK4 pulses (also shown in dotted line) would also occur prematurely.

From FIGS. 2 and 3 it can be seen that regardless of the magnitude of the phase shift between CLK1 and CLK2, the time delay between the triggering signal TRIG and the first CLK4 pulse is $(J \times T)+(P \times T/360)$ seconds and the interval between each subsequent CLK4 pulse is $N \times T$ seconds. Since the magnitude of P, J and N are functions of externally generated digital data D1, D2 and D3, the timing of the first CLK4 pulse and the frequency of the CLK4 signal is predictable and controllable with an accuracy determined primarily by the ability of the skewing circuit 10 to accurately adjust the phase angle P between CLK1 and CLK2.

Figure 4:
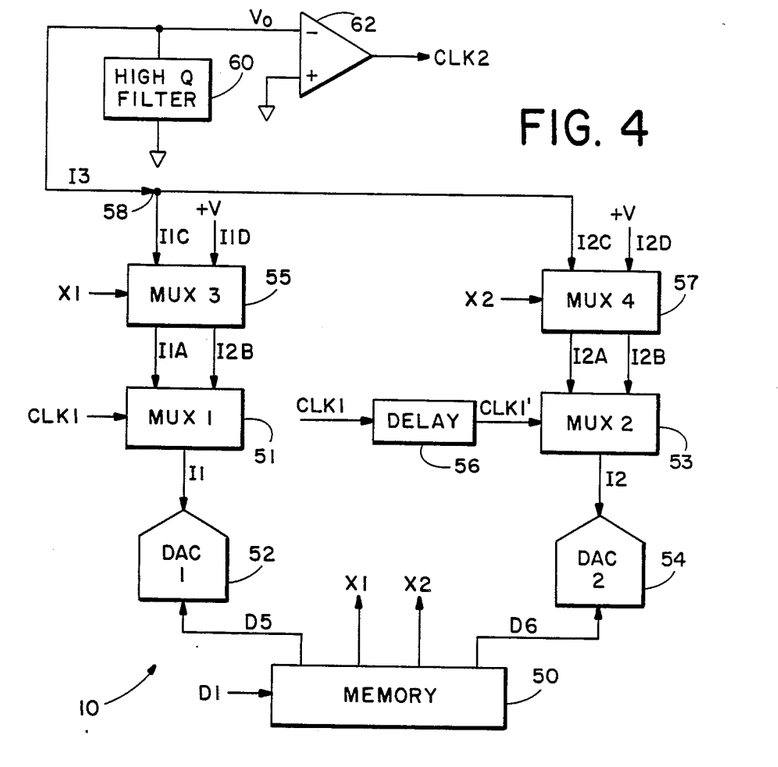
FIG. 4 is a block diagram of the skewing circuit of the programmable skew signal generator of FIG. 1.

Referring to FIG. 4, the skewing circuit 10 of FIG. 1, depicted in block diagram form, includes a memory 50 addressed by the phase angle data D1. When D1 is set to represent a desired phase angle P (from 0 to 360 degrees) between the CLK1 and CLK2 signals, memory 50 outputs data D5, D6, X1 and X2 stored at the address corresponding to the desired phase angle. The magnitude of data D5 is proportional to the absolute value of the cosine of the phase angle P corresponding to the memory address at which the data D5 is stored. The magnitude of data D6 is proportional to the absolute value of the sine of the corresponding phase angle P. Data X1 and X2 are single bits used as binary control signals which are high or low depending on the magnitude of the corresponding phase angle P according to the following Table I:

TABLE I

| Quadrant | P (Degrees) | X1 | X2 |
|---|---|---|---|
| First | 0 to 90 | 0 | 0 |
| Second | 90 to 180 | 1 | 0 |
| Third | 180 to 270 | 1 | 1 |
| Fourth | 270 to 360 | 0 | 1 |

Figure 6:
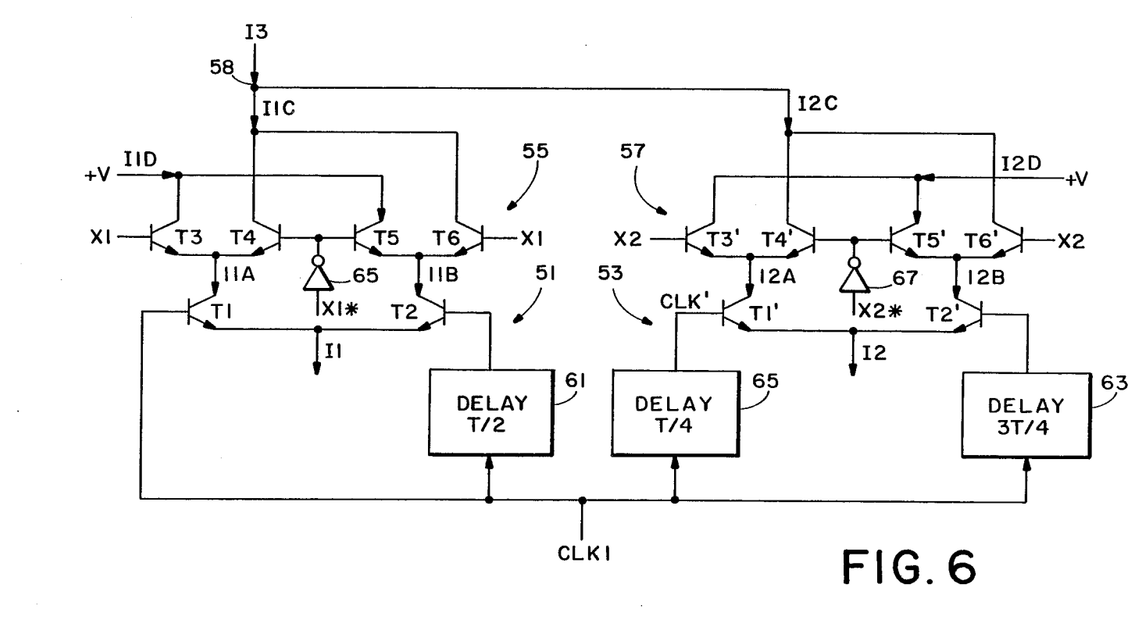
FIG. 6 is a schematic diagram of a portion of the skewing circuit of FIG. 4.

It is noted that the X2 signal is high whenever the phase angle P exceeds 180 degrees and is low whenever the phase angle is less than 180 degrees as required for proper operation of the timing circuit 12 of FIG. 6.

The data D5 output of memory 50 is applied as input to a first digital to analog converter 52 which acts as a constant current source, drawing a current I1 of magnitude proportional to the magnitude of data D5. Data D6 is applied as the digital input to a second digital to analog converter 54 which also acts as a constant current source, drawing a current I2 of magnitude proportional to the magnitude of data D6.

The skewing circuit 10 also includes a set of four multiplexer circuits. The switching state of a $2 \times 1$ multiplexer 51 (MUX1) is controlled by the CLK1 signal and the switching state of another $2 \times 1$ multiplexer 53 (MUX2) is controlled by an output signal CLK1' of a delay circuit 56 which produces the CLK1' signal by delaying the CLK1 signal by one quarter of a CLK1 period T, or 2.5 nsec for a 100 MHz CLK1 signal. The switching state of a $2 \times 2$ multiplexer 55 (MUX3) is controlled by the X1 signal while the switching state of another $2 \times 2$ multiplexer 57 (MUX4) is controlled by the X2 signal. The current I1 drawn by converter 52 is modulated by MUX1 in response to CLK1 (a square wave of 50% duty cycle) to produce a pair of square wave currents I1A and I1B, having peak magnitudes proportional to the cosine of phase angle P, current I1A being in phase with CLK1 and current I1B being 180 degrees out of phase with CLK1. Multiplexer MUX3 has two inputs, currents I1C and I1D, and two outputs, the currents I1A and I1B which are provided as the inputs to MUX1. When X1 is low, MUX3 provides its I1C input current as its I1CA output current and provides its I1D input current as its I1C output current. Conversely, when X1 is high, MUX3 draws its I1A output current from its I1D input current and draws its I1B output current from its I1C input current. The I1C current is obtained through a node 58 while the I1D current is obtained from a positive voltage source +V.

The current I2 drawn by converter 54 is modulated by MUX2 in response to CLK1' to produce a another pair of square wave currents I2A and I2B, having peak magnitudes proportional to the sine of phase angle P, current I2A lagging CLK1 by 90 degrees and current I1B lagging CLK1 by 270 degrees. Multiplexer MUX4 has two inputs, currents I2C and I2D, and two outputs, the currents I1A and I1B input to MUX2. When X2 is low, MUX4 provides its I2C input current as its I2A output current and provides its I2D input current as its I2B input current. When X2 is high, MUX4 provides its I2D input current as its I2A output current and its I2C input current as its I2B output current. The I2C input current is obtained through mode 58 and the I2D input current is obtained from a positive voltage source +V.

A current I3 into node 58 resulting from the combination of I1C and I2C currents out of node 58 is obtained from ground through a high Q filter 60. A voltage Vo developed across filter 60 as a result of I3 is applied to an inverting input of a comparator 62, a non-inverting input of the comparator being connected to ground. The output of comparator 62 comprises the CLK2 output signal of the skewing circuit 10.

Figure 5A:
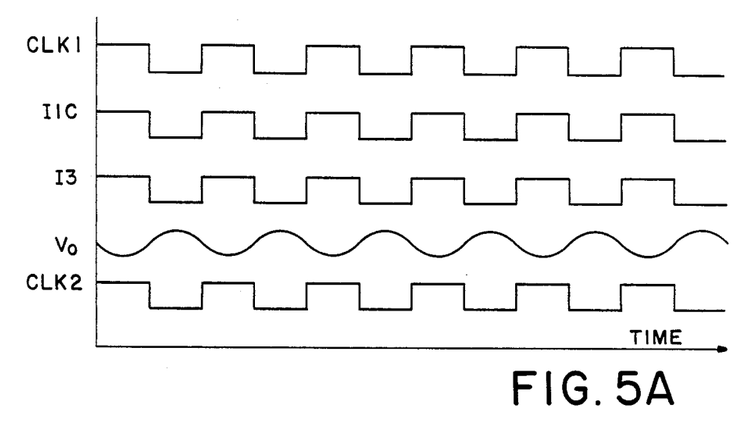
FIGS. 5A-5C are timing diagrams illustrating examples of the operation of the skewing circuit of FIG. 4.

The operation of skewing circuit 10 is described with reference to FIG. 4 and the timing diagrams of FIGS. 5A–5C which illustrate the time varying behavior of the relevant signals of FIG. 4 when the desired phase angle P between CLK1 and CLK2 is by way of example 0, 45 and 315 degrees, respectively. FIG. 5A illustrates the operation of skewing circuit 10 when the phase angle P indicated by data D1 in 0 degrees. In such case X1 and X2, according to Table I, are both low causing multiplexers MUX3 and MUX4 to supply currents I1A and I2A from node 58 and to supply currents I1D and I2D from the +V voltage source. The magnitude of data D5 produced by memory 50 is 1, the absolute value of the cosine of the phase angle P (0 degrees), and therefore current I1 has a maximum value, for instance 100 mA. Currents I1A and I1C appear as a square wave signals in phase with CLK1. The magnitude of data D6, equal to the sine of phase angle P (0 degrees), is 0 and therefore currents I2C and I2D are zero at all times. Thus only current I1C (derived from current I1A) contributes to current I3, which appears as a square wave in phase with CLK1. The voltage Vo developed across filter 60 is a sine wave oscillating about 0 potential and the comparator output CLK2 is a square wave in phase with CLK1.

Figure 5B:
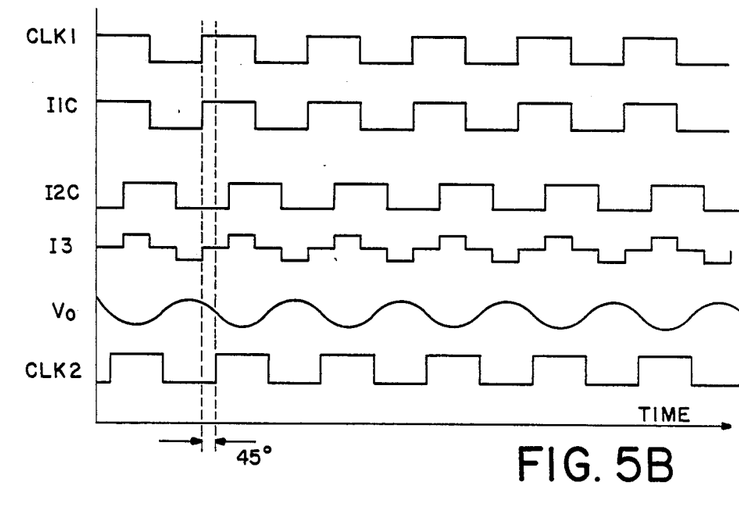

FIG. 5B illustrates the operation of skewing circuit 10 when the phase angle P indicated by input data D1 is 45 degrees. Again, according to Table I, X1 and X2 are both low such that multiplexers MUX3 and MUX4 supply currents I1A and I2A from node 58 but in this case the magnitude of D5 produced by memory 50 is 0.707, the absolute value of the cosine of 45 degrees. Therefore the current I1 has a magnitude fo 0.707 of maximum, for instance 70.7 mA instead of 100 mA. Thus current I1C again appears as a square wave in phase with CLK1 but the peak magnitude of I1C is only 0.707 of that obtained when the phase angle is 0. The magnitude of D6, equal to the sine of 45 degrees, is also 0.707 of maximum so current I2C supplies current I2A and therefore appears as a square wave lagging CLK1 by 90 degrees and has a peak magnitude 0.707 of maximum. Currents I1C and I2C combine to form current I3, which is a periodic, stepped waveform. The voltage Vo developed across comparator 62 resulting from current I3 is a sine wave as shown in FIG. 5B. Voltage Vo causes comparator 62 to produce a square wave CLK2 output lagging CLK1 by 45 degrees. When the phase angle is another value between 0 and 90 degrees, the currents I1C and I2C still lag CLK1 by 0 and 90 degrees respectively, but the peak magnitudes of currents I1C and I2C differ from 0.707 maximum, with I2 increasing from 0 to maximum and with I1C decreasing from maximum to 0 as the phase angle is increased from 0 l to 90 degrees. As I2C increases and I1C decreases, sine wave voltage Vo shifts to the right in proportion to I2C (or in inverse proportion to I1C), thereby proportionately increasing the phase angle P between the leading edge of CLK1 and CLK2 pulses.

Figure 5C:
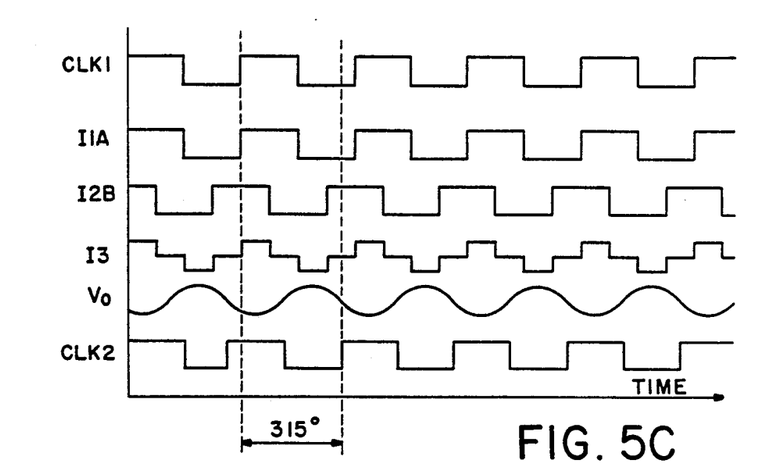

FIG. 5C illustrates the operation of skewing circuit 10 when the phase angle set by data D1 is 315 degrees. According to Table I, X1 is low and X2 is high such that MUX3 and MUX4 draw currents I1A and I2B from node 58. The magnitude of D5 produced by memory 50 is 0.707, i.e., the absolute value of the cosine of 315 degrees. Current I1C still appears as a square wave in phase with CLK1 and has a peak magnitude of 0.707 of maximum. The magnitude of D6, equal to the absolute value of the sine of 315 degrees, is also 0.707 of maximum and current I2C also appears as a square wave. However in this case, with X2 high, current I2C supplies current I2B, and therefore I2C lags CLK1 by 270 degrees. Currents I1C and I2C combine to form current I3 as shown in FIG. 5C, producing the sine wave voltage Vo developed across comparator 62 also shown in FIG. 5C. The voltage Vo causes comparator 62 to provide a square wave CLK2 output lagging CLK1 by 315 degrees.

The skewing circuit 10 operates in a similar fashion for phase angles from 90 to 270 degrees except that signals X1 and X2 ensure that current I1C supplies current I1A and current I2C supplies current I2B when P is between 90 and 180 degrees, and to ensure that current I1C supplies current I1B and current I2C supplies current I2B when P is between 180 and 270 degrees. Thus the resolution of the phase angle adjustment depends on the resolution of digital to analog converters 52 and 54 and on the size of data D5 and D6 which can be stored in memory 50.

Referring to FIG. 6, the multiplexers 51, 53, 55 and 57 of the skewing circuit 10 of FIG. 4 are depicted in more detailed schematic diagram form. Multiplexer 51 includes a first pair of emittercoupled NPN transistors T1 and T2, and multiplexer 55 includes a second pair of emitter-coupled NPN transistors T3 and T4 and a third pair of emitter coupled NPN transistors T5 and T6. The base of T1 is controlled by the CLK1 signal. The base of T2 is also controlled by the CLK1 signal, delayed by one half of its period T by a delaying circuit 61. The X1 signal is applied to the bases of T3 and T6 while an X1* signal, the inverse logic state of X1, is connected to the bases of T4 and T5. The X1* signal is produced by a logic inverter 65 having X1 as an input. The +V voltage source of FIG. 4, which supplies current I1D, is connected to the collectors of T3 and T5, and node 58 of FIG. 4, which produces current I1C, is connected to the collectors of T4 and T6. The emitters of T3 and T4 provide current I1A to the collector of T1, the emitters of T5 and T6 providing current I1B to the collector of T2. The emitters of T1 and T2 supply current I1 to digital to analog converter 52 of FIG. 4.

When CLK1 is high, T1 is on and T2 is off. The current I1 is supplied from current I1A, in turn supplied by either T3 or T4 depending on the state of X1. If X1 is high, T3 is on and T4 is off and current I1A is supplied by current I1D from voltage source +V. If X1 is low, T4 is on and T3 is off and current I1A is provided through T4 by current I1C. Since CLK1 is a 50% duty cycle square wave, when CLK1 goes low it turns off T1 and the output of delay circuit 61 goes high to turn on T2. During the low portion of a CLK1 cycle, current I1 is supplied by T2, drawing current I1B through T5 or T6 depending on the state of X1. If X1 is high, T6 is on and supplies I1B by drawing current I1C from node 58. If X1 is low, T5 is on and supplies I1B by drawing I1D from the positive voltage source.

Multiplexer 53 includes a pair of emittercoupled NPN transistors T1' and T2', and multiplexer 57 includes a second pair of emitter-coupled NPN transistors T3' and T4' and a third pair of emitter coupled NPN transistors T5' and T6'. The base of T1' is controlled by the CLK1' signal, comprising the CLK1 signal delayed by one fourth of its period by delay circuit 56. The base of T2' is also controlled by the CLK1 signal, delayed by three fourths of its period T by another delaying circuit 63. The X2 signal is applied to the bases of T3' and T6' while an X2* signal, comprising the inverse of X2, drives the bases of T4' and T5'. The X2* signal is produced by a logic inverter 67 having X2 as an input. The +V voltage source of FIG. 4, which supplies current I2D, is connected to the collectors of T3' and T5', and node 58 of FIG. 4, which produces current I2C, is connected to the collectors of T4' and T6'. The emitters of T3' and T4' supply current I2A to the collector of T1', with the emitters of T5' and T6' providing current I2B to the collector of T2'. The emitters of T1' and T2' produce current I2 supplied to digital to analog converter 54 of FIG. 4.

When CLK1' is high, T1' is on and T2' is off. The current I1' is supplied from current I2A which is in turn supplied by either T3' or T4' depending on the state of X2. If X2 is high, T3' is on and T4' is off, and current I2A is supplied by current I2D from voltage source +V. If X2 is low, T4' is on and T3' is off, and current I2A is provided through T4' by current I2C. One quarter of a period T after CLK1 goes low, T1' turns off, T2' turns on, and current I2 is provided by T2', drawing current I2B through T5' or T6', depending on the state of X2. If X2 is high, T6' is on and supplies I2B by drawing current I2C from node 58. If X2 is low, T5' is on and supplies I2B by drawing I2D from the positive voltage source.

Figure 7:
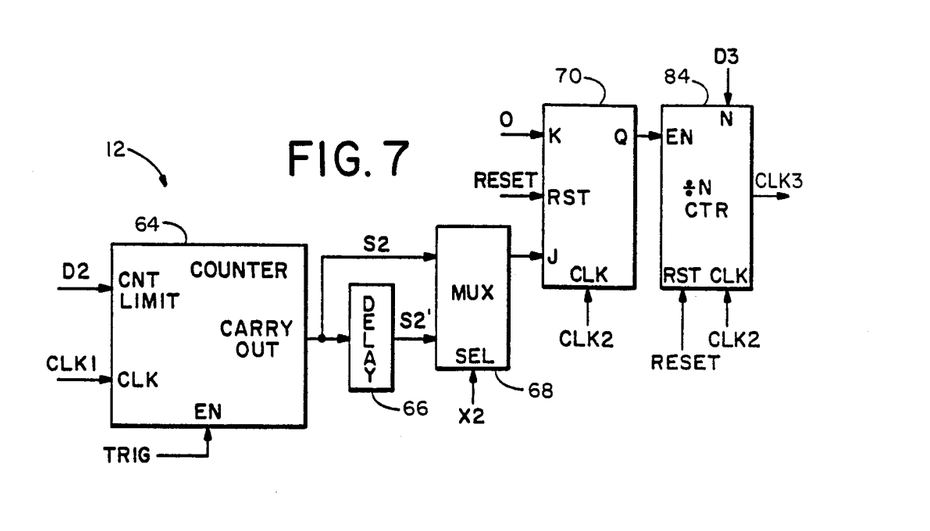
FIG. 7 is a block diagram of the timing circuit of FIG. 1.

Referring to FIG. 7, the timing circuit 12 of FIG. 1 depicted in more detailed block diagram form comprises a pulse counter 64, a delay circuit 66, a multiplexer 68, and a J-K flip-flop 70. Counter 64 counts pulses of the CLK1 signal applied to a clock input and provides an output signal S2 when the clock pulse count reaches a count limit determined by data D2 applied to a count limit input of counter 64. The counter 64 is cleared with the TRIG signal. The S2 signal is directly applied to one input of the multiplexer 68 and is indirectly applied to another input of the multiplexer through a delay circuit 66 delaying the signal S1 by one fourth of a CLK1 period, or 2.5 nsec for a 100 MHz CLK1 signal. The switching state of multiplexer 68 is controlled by the X2 signal from skewing circuit 10 of FIG. 1 and the output of multiplexer 68, either S2 (when X2 is low) or the output S2' of delay circuit 66 (when X2 is high), is connected to the J input of flip-flop 70. A logic level 0 drives the K input of flip-flop 70, with the CLK2 signal driving the clock input of the flip-flop. The S1 enabling signal is developed at the Q output of the flip-flop and this signal is applied to an enable input of the divide-by-N counter 14.

After the TRIG signal clears counter 64, the counter begins counting CLK1 pulses until the count limit J determined by data D2 is reached. At this point the counter produces the S2 signal which is passed either directly or in delayed form S2' to the J input of flip-flop 70 via multiplexer 68, thereby setting the Q output of flip-flop 70 on the next CLK2 pulse to produce the S1 enabling signal. When signal generation is complete, the flip-flop 70 and divide-by-N counter 14 are reset by a reset signal from the microprocessor.

Thus triggered, programmable skew signal generator of the present invention is adapted to produce a periodic output signal of adjustable frequency commencing an adjustable time following a triggering signal. The frequency and the timing of the periodic output signal are controllable with a high degree of accuracy by externally generated digital control data.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for producing a periodic output signal which is phase skewed from a periodic reference signal by an adjustable phase angle comprising:
   signal generating means responsive to data indicating the magnitude of said adjustable phase angle for generating a first analog signal of magnitude proportional to the value of the cosine of said adjustable phase angle, and for generating a second analog signal of magnitude proportional to the value of the sine of said adjustable phase angle;
   first means responsive to said periodic reference signal for modulating said first analog signal to produce a first square wave signal, said first square wave signal being in phase with said periodic reference signal;
   second means responsive to said periodic reference signal for modulating said second analog signal to produce a second square wave signal, said second square wave signal lagging said periodic reference signal by 90 degrees; and
   means for combining and filtering said first and second square wave signals to produce a periodic output signal.

2. An apparatus for producing a periodic output signal which is phase skewed from a periodic reference signal by an adjustable phase angle comprising:
   signal generating means responsive to data indicating the magnitude of said adjustable phase angle for generating a first analog signal of magnitude proportional to the value of the cosine of said adjustable phase angle, and for generating a second analog signal of magnitude proportional to the value of the sine of said adjustable phase angle;
   first means responsive to said periodic reference signal for modulating said first analog signal to produce a first square wave signal, said first square wave signal being in phase with said periodic reference signal;
   second means responsive to said periodic reference signal for modulating said second analog signal to produce a second square wave signal, said second square wave signal lagging said periodic reference signal by 90 degrees; and
   means for combining and filtering said first and second square wave signals to produce a periodic output signal;
   wherein said signal generating means comprises:
      an addressable memory, addressed by data representing the magnitude of said adjustable phase angle, for storing at memory addresses corresponding to phase angles first data of magnitude representing the absolute value of the cosine of the corresponding phase angle, and second data of magnitude representing the absolute value of the sine of the corresponding phase angle;

a first digital to analog converter for receiving said first data and for generating said first analog signal of magnitude proportional to the magnitude of said first data; and a second digital to analog converter for receiving said second data for generating said second analog signal of magnitude proportional to the magnitude of said second data.

3. An apparatus for producing a periodic output signal which is phase skewed from a periodic reference signal by an adjustable phase angle comprising:

signal generating means responsive to data indicating the magnitude of said adjustable phase angle for generating a first analog signal of magnitude proportional to the absolute value of the cosine of said adjustable phase angle, for generating a second analog signal of magnitude proportional to the absolute value of the sine of said adjustable phase angle, and for generating an indicating signal indicating in which of first, second, third and fourth quadrants said adjustable phase angle is contained, wherein said first quadrant comprises phase angles between zero and 90 degrees, said second quadrant comprises phase angles between 90 and 180 degrees, said third quadrant comprises phase angles between 180 and 270 degrees, and said fourth quadrant comprises phase angles between 270 and 360 degrees;

first modulating means responsive to said periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said fourth square wave signal lagging said periodic reference signal by 270 degrees; and signal selection and combining means responsive to said indicating signal for combining a selected two of said first, second, third and fourth square wave signals to produce a periodic fifth signal, said selection being made according the quadrant of said adjustable phase angle indicated by said indicating signal.

4. The apparatus according to claim 3 further comprising filter means for filtering said periodic fifth signal, thereby producing a periodic sixth signal phase related to said periodic reference signal according to said adjustable phase angle.

5. An apparatus for producing a periodic output signal which is phase skewed from a periodic reference signal by an adjustable phase angle comprising:

signal generating means responsive to data indicating the magnitude of said adjustable phase angle for generating a first analog signal of magnitude proportional to the absolute value of the cosine of said adjustable phase angle, for generating a second analog signal of magnitude proportional to the absolute value of the sine of said adjustable phase angle, and for generating an indicating signal indicating in which of first, second, third and fourth quadrants said adjustable phase angle is contained, wherein said first quadrant comprises phase angle between zero and 90 degrees, said second quadrant comprises phase angles between 90 and 180 degrees, said third quadrant comprises phase angles between 180 and 270 degrees, and said fourth quadrant comprises phase angles between 270 and 360 degrees;

first modulating means responsive to said periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said fourth square wave signal lagging said periodic reference signal by 270 degrees; and signal selection and combining means responsive to said indicating signal for combining a selected two of said first, second, third and fourth square wave signals to produce a periodic fifth signal, said selection being made according the quadrant of said adjustable phase angle indicated by said indicating signal, wherein said signal selection and combining means comprises:

first multiplexing means, responsive to said indicating signal and having said first and second square wave signals as inputs, for providing said input first square wave signal as a first output signal when said said indicating signal indicates said adjustable phase angle is within one of said first and fourth quadrants and for providing said input second square wave signal as the first output signal when said indicating signal indicates said adjustable phase angle is within one of said second and third quadrants;

second multiplexing means, responsive to said indicating signal and having said third and fourth square wave signals as inputs, for providing said input third square wave signal as a second output signal when said said indicating signal indicates said adjustable phase angle is within one of said first and second quadrants and for providing said fourth square wave signal as said second output signal when said indicating signal indicates said adjustable phase angle is within one of said third and fourth quadrants; and means for combining said first and second output signals to produce said periodic fifth signal.

6. An apparatus for producing a periodic output signal which is phase skewed from a periodic reference signal by an adjustable phase angle comprising:

signal generating means responsive to data indicating the magnitude of said adjustable phase angle for generating a first analog signal of magnitude proportional to the absolute value of the cosine of said adjustable phase angle, for generating a second analog signal of magnitude proportional to the absolute value of the sine of said adjustable phase angle, and for generating an indicating signal indicating in which of first, second, third and fourth quadrants said adjustable phase angle is contained, wherein said first quadrant comprises phase angles between zero and 90 degrees, said second quadrant comprises phase angles between 90 and 180 degrees, said third quadrant comprises phase angles between 180 and 270 degrees, and said fourth quadrant comprises phase angles between 270 and 360 degrees;

first modulating means responsive to said periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said fourth square wave signal lagging said periodic reference signal by 270 degrees; and signal selection and combining means responsive to said indicating signal for combining a selected two of said first, second, third and fourth square wave signals to produce a periodic fifth signal, said selection being made according the quadrant of said adjustable phase angle indicated by said indicating signal;

wherein said first modulating means comprises:
first switch means responsive to said periodic reference signal for modulating said first analog signal to produce said first square wave signal, said first square wave signal being in phase with said periodic reference signal;
means for delaying said periodic reference signal by one half of its period, thereby producing a delayed periodic reference signal; and
second switch means responsive to said delayed periodic reference signal for modulating said first analog signal to produce said second square wave signal, said second square wave signal being in phase with said delayed periodic reference signal.

7. An apparatus for producing a periodic output signal which is phase skewed from a periodic reference signal by an adjustable phase angle, the apparatus comprising:
an addressable memory, addressed by phase angle data representing the magnitude of said adjustable phase angle, for storing at memory addresses corresponding to phase angles first data of magnitude representing the absolute value of the cosine of the corresponding phase angle, second data of magnitude representing the absolute value of the sine of the corresponding phase angle, and third data indicating in which of first, second, third and fourth quadrants said adjustable phase angle is contained, wherein said first quadrant comprises phase angles from zero to 90 degrees, said second quadrant comprises phase angles from 90 to 180 degrees, said third quadrant comprises phase angles from 180 to 270 degrees, and said fourth quadrant contains phase angles from 270 to 360 degrees, said addressable memory outputting said first, second and third data when addressed by said phase angle data;
a first digital to analog converter for generating a first analog signal of magnitude proportional to the magnitude of said first data;
a second digital to analog converter for generating a second analog signal of magnitude proportional to the magnitude of said second data;
first modulating means responsive to a periodic reference signal for modulating said first analog signal to produce first and second square wave signals, said first square wave signal being in phase with said periodic reference signal and said second square wave signal lagging said periodic reference signal by 180 degrees;
second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees;
signal selection and combining means responsive to said third data for combining a selected two of said first, second, third and fourth square wave signals to produce a periodic fifth signal, said selection being made according the quadrant of said adjustable phase angle indicated by said third data; and
filter means for filtering said periodic fifth signal, thereby producing a periodic sixth signal phase related to said periodic reference signal according to said adjustable phase angle.

8. An apparatus for producing a periodic output signal which is phase skewed from a periodic reference signal by an adjustable phase angle, the apparatus comprising:
an addressable memory, addressed by phase angle data representing the magnitude of said adjustable phase angle, for storing at memory addresses corresponding to phase angles first data of magnitude representing the absolute value of the cosine of the corresponding phase angle, second data of magnitude representing the absolute value of the sine of the corresponding phase angle, and third data indicating in which of first, second, third and fourth quadrants said adjustable phase angle is contained, wherein said first quadrant comprises phase angles from zero to 90 degrees, said second quadrant comprises phase angles from 90 to 180 degrees, said third quadrant comprises phase angles from 180 to 270 degrees, and said fourth quadrant contains phase angles from 270 to 360 degrees, said addressable memory outputting said first, second and third data when addressed by said phase angle data;
a first digital to analog converter for generating a first analog signal of magnitude proportional to the magnitude of said first data;
a second digital to analog converter for generating a second analog signal of magnitude proportional to the magnitude of said second data;
first modulating means responsive to a periodic reference signal for modulating said first analog signal to produce first and second square wave signals, said first square wave signal being in phase with said periodic reference signal and said second square wave signal lagging said periodic reference signal by 180 degrees;
second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees;

signal selection and combining means responsive to said third data for combining a selected two of said first, second, third and fourth square wave signals to produce a periodic fifth signal, said selection being made according the quadrant of said adjustable phase angle indicated by said third data; and filter means for filtering said periodic fifth signal, thereby producing a periodic sixth signal phase related to said periodic reference signal according to said adjustable phase angle;

wherein said signal selection and combining means comprises:

first multiplexing means, responsive to said indicating signal and having said first and second square wave signals as inputs, for providing said input first square wave signal as a first output signal when said said third data indicates said adjustable phase angle is within one of said first and fourth quadrants, and for providing said input second square wave signal as the first output signal when said third data indicates said adjustable phase angle is within one of said second and third quadrants;

second multiplexing means, responsive to said indicating signal and having said third and fourth square wave signals as inputs, for providing said input third square wave signal as a second output signal when said third data indicates said adjustable phase angle is within one of said first and second quadrants, and for providing said input fourth square wave signal as said second output signal when said third data indicates said adjustable phase angle is within one of said third and fourth quadrants; and means for combining said first and second output signals to produce said periodic fifth signal.

9. An apparatus for producing a periodic output signal which is phase skewed from a periodic reference signal by an adjustable phase angle, the apparatus comprising:

an addressable memory, addressed by phase angle data representing the magnitude of said adjustable phase angle, for storing at memory addresses corresponding to phase angles first data of magnitude representing the absolute value of the cosine of the corresponding phase angle, second data of magnitude representing the absolute value of the sine of the corresponding phase angle, and third data indicating in which of first, second, third and fourth quadrants said adjustable phase angle is contained, wherein said first quadrant comprises phase angles from zero to 90 degrees, said second quadrant comprises phase angles from 90 to 180 degrees, said third quadrant comprises phase angles from 180 to 270 degrees, and said fourth quadrant contains phase angles from 270 to 360 degrees, said addressable memory outputting said first, second and third data when addressed by said phase angle data;

a first digital to analog converter for generating a first analog signal of magnitude proportional to the magnitude of said first data;

a second digital to analog converter for generating a second analog signal of magnitude proportional to the magnitude of said second data;

first modulating means responsive to a periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees;

signal selection and combining means responsive to said third data for combining a selected two of said first, second, third and fourth square wave signals to produce a periodic fifth signal, said selection being made according the quadrant of said adjustable phase angle indicated by said third data; and filter means for filtering said periodic fifth signal, thereby producing a periodic sixth signal phase related to said periodic reference signal according to said adjustable phase angle;

wherein said first modulating means comprises:

first switch means responsive to said periodic reference signal for modulating said first analog signal to produce said first square wave signal, said first square wave signal being in phase with said periodic reference signal;

means for delaying said periodic reference signal by one half of its period, thereby producing a delayed periodic reference signal; and second switch means responsive to said delayed periodic reference signal for modulating said first analog signal to produce said second square wave signal, said second square wave signal being in phase with said delayed periodic reference signal.

10. An apparatus for producing a periodic output signal which is phase skewed from a periodic reference signal by an adjustable phase angle, the apparatus comprising:

an addressable memory, addressed by phase angle data representing the magnitude of said adjustable phase angle, for storing at memory addresses corresponding to phase angles first data of magnitude representing the absolute value of the cosine of the corresponding phase angle, second data of magnitude representing the absolute value of the sine of the corresponding phase angle, and third data indicating in which of first, second, third and fourth quadrants said adjustable phase angle is contained, wherein said first quadrant comprises phase angles from zero to 90 degrees, said second quadrant comprises phase angles from 90 to 180 degrees, said third quadrant comprises phase angles from 180 to 270 degrees, and said fourth quadrant contains phase angles from 270 to 360 degrees, said addressable memory outputting said first, second and third data when addressed by said phase angle data;

a first digital to analog converter for generating a first analog signal of magnitude proportional to the magnitude of said first data;

a second digital to analog converter for generating a second analog signal of magnitude proportional to the magnitude of said second data;

first modulating means responsive to a periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees;

signal selection and combining means responsive to said third data for combining a selected two of said first, second, third and fourth square wave signals to produce a periodic fifth signal, said selection being made according the quadrant of said adjustable phase angle indicated by said third-data;

filter means for filtering said periodic fifth signal, thereby producing a periodic sixth signal phase related to said periodic reference signal according to said adjustable phase angle; and comparator means having a first input receiving said periodic sixth signal and having a second input for receiving a reference potential, for producing a binary output signal of a first state when the magnitude of said periodic sixth signal exceeds the magnitude of said reference potential and of a second state when the magnitude of said input potential is less than said reference potential.

11. An apparatus for generating a periodic clock signal of adjustable frequency commencing an adjustable time following a triggering signal, the apparatus comprising;

a skewing circuit for phase shifting a reference clock signal by an adjustable phase angle thereby to produce a phase shifted clock signal;

timing means for receiving said triggering signal and for producing an enabling signal after a time interval of adjustable duration following receipt of said triggering signal;

means for receiving said enabling signal and said phase shifted clock signal and for frequency dividing said phase shifted clock signal commencing on receipt of said enabling signal, said division being by an adjustable frequency dividing ratio, thereby to produce a frequency divided clock signal; and logic gate means for receiving said phase shifted clock signal and said frequency divided clock signal and for combining said phase shifted clock signal and said frequency divided clock signal to generate said periodic clock signal.

12. The apparatus of claim 11 wherein said skewing circuit comprises:

signal generating means responsive to data indicating the magnitude of said adjustable phase angle for generating a first analog signal of magnitude proportional to the absolute value of the cosine of said adjustable phase angle, for generating a second analog signal of magnitude proportional to the absolute value of the sine of said adjustable phase angle, and for generating an indicating signal indicating in which of first, second, third and fourth quadrants said adjustable phase angle is contained, wherein said first quadrant comprises phase angles between zero and 90 degrees, said second quadrant comprises phase angles between 90 and 180 degrees, said third quadrant comprises phase angles between 180 and 270 degrees, and said fourth quadrant comprises phase angles between 270 and 360 degrees;

first modulating means responsive to said periodic reference signal for modulating said first analog signal to produce first and second square wave signals, said first square wave signal being in phase with said periodic reference signal and said second square wave signal lagging said periodic reference signal by 180 degrees;

second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees; and signal selection and combining means responsive to said indicating signal for combining a selected two of said first, second, third and fourth square wave signals to produce a periodic fifth signal, said selection being made according the quadrant of said adjustable phase angle indicated by said indicating signal.

13. An apparatus for generating a periodic clock signal of adjustable frequency commencing an adjustable time following a triggering signal, the apparatus comprising:

a skewing circuit for phase shifting a reference clock signal by an adjustable phase angle thereby to produce a phase shifted clock signal and an indicating signal indicating whether said phase angle is positive or negative;

timing means for receiving said triggering signal and for producing an enabling signal after a time interval of adjustable duration following receipt of said triggering signal;

means for receiving said enabling signal and said phase shifted clock signal and for frequency dividing said phase shifted clock signal commencing on receipt of said enabling signal, said division being by an adjustable frequency dividing ratio, thereby to produce a frequency divided clock signal; and logic gate means for receiving said phase shifted clock signal and said frequency divided clock signal and for combining said phase shifted clock signal and said frequency divided clock signal to generate said periodic clock signal;

wherein said timing means for producing an enabling signal comprises:

a counter responsive to first digital control data for counting reference signal periods, said counter generating an output signal upon counting a number of reference signal periods determined according to the magnitude of said first digital control data;

delay means for delaying said counter output signal by one half of the period of said periodic reference signal thereby to produce a delayed counter output signal;

multiplexer means connected to receive as inputs said counter output signal and said delayed counter output signal and to output a selected one of said counter output and delayed counter signals, said indicating signal determining which of said counter output and delayed counter output signals is selected as a multiplexer output signal; and latch means, clocked by said phase shifted clock signal, for receiving said multiplexer output signal, and for producing said enabling signal when clocked by said phase shifted clock signal following receipt of said multiplexer output signal.

14. An apparatus for generating a periodic clock signal for adjustable frequency commencing an adjustable time following a triggering signal, the apparatus comprising;
   a skewing circuit for phase shifting a reference clock signal by an adjustable phase angle thereby to produce a phase shifted clock signal;
   timing means for receiving said triggering signal and for producing an enabling signal after a time interval of adjustable duration following receipt of said triggering signal;
   means for receiving said enabling signal and said phase shifted clock signal and for frequency dividing said phase shifted clock signal commencing on receipt of said enabling signal, said division being by an adjustable frequency dividing ratio, thereby to produce a frequency divided clock signal; and
   logic gate means for receiving said phase shifted clock signal and said frequency divided clock signal and for combining said phase shifted clock signal and said frequency divided clock signal to generate said periodic clock signal;
   wherein said means for frequency dividing said phase shifted clock signal comprises a divide-by-N counter for counting phase shifted clock signal cycles and for producing an output pulse every N phase shifted clock signal cycles, where N is an integer determined according to applied digital control data, said divide-by-N counter being count enabled by said enabling signal.

15. An apparatus for generating a periodic clock signal of adjustable frequency commencing an adjustable time following a triggering signal, the apparatus comprising;
   a skewing circuit for phase shifting a reference clock signal by an adjustable phase angle thereby to produce a phase shifted clock signal;
   timing means for receiving said triggering signal and for producing an enabling signal after a time interval of adjustable duration following receipt of said triggering signal;
   means for receiving said enabling signal and said phase shifted clock signal and for frequency dividing said phase shifted clock signal commencing on receipt of said enabling signal, said division being by an adjustable frequency dividing ratio, thereby to produce a frequency divided clock signal; and
   logic gate means for receiving said phase shifted clock signal and said frequency divided clock signal and for combining said phase shifted clock signal and said frequency divided clock signal to generate said periodic clock signal wherein said logic gate means comprises an AND gate, said phase shifted clock signal and said frequency divided clock signal being applied as inputs to said AND gate, said AND gate providing said periodic clock signal as an output.

16. An apparatus for generating a periodic clock signal of adjustable frequency commencing an adjustable time following a triggering signal, the apparatus comprising;
   signal generating means responsive to data indicating the magnitude of said adjustable phase angle for generating a first analog signal of magnitude proportional to the absolute value of the cosine of said adjustable phase angle, for generating a second analog signal of magnitude proportional to the absolute value of the sine of said adjustable phase angle, and for generating an indicating signal indicating in which of first, second, third and fourth quadrants said adjustable phase angle is contained, wherein said first quadrant comprises phase angles between zero and 90 degrees, said second quadrant comprises phase angles between 90 and 180 degrees, said third quadrant comprises phase angles between 180 and 270 degrees, and said fourth quadrant comprises phase angles between 270 and 360 degrees;
   first modulating means responsive to a periodic reference signal for modulating said first analog signal to produce first and second square wave signals, said first square wave signal being in phase with said periodic reference signal and said second square wave signal lagging said periodic reference signal by 180 degrees;
   second modulating means responsive to said periodic reference signal for modulating said second analog signal to produce third and fourth square wave signals, said third square wave signal lagging said periodic reference signal by 90 degrees and said second square wave signal lagging said periodic reference signal by 270 degrees;
   signal selection and combining means responsive to said indicating signal for combining a selected two of said first, second, third and fourth square wave signals to produce a periodic fifth signal, said selection being made according the quadrant of said adjustable phase angle indicated by said indicating signal;
   timing means for receiving said triggering signal and for producing an enabling signal after a time interval of adjustable duration following receipt of said triggering signal;
   means for receiving said enabling signal and said phase shifted clock signal and for frequency dividing said phase shifted clock signal commencing on receipt of said enabling signal, said division being by an adjustable frequency dividing ratio, thereby to produce a frequency divided clock signal;
   logic gate means for receiving said phase shifted clock signal and said frequency divided clock signal and for combining said phase shifted clock signal and said frequency divided clock signal to generate said periodic clock signal; and
   filter means for filtering said periodic fifth signal, thereby producing a periodic sixth signal phase related to said periodic reference signal according to said adjustable phase angle.

17. The apparatus according to claim 16 wherein said signal generating means comprises:
   an addressable memory, addressed by data representing the magnitude of said adjustable phase angle, for storing at memory addresses corresponding to phase angles first data of magnitude representing the absolute value of the cosine of the corresponding phase angle, second data of magnitude representing the absolute value of the sine of the corresponding phase angle, and third data representing the quadrant of the corresponding phase angle, said addressable memory outputting said first, second and third data when addressed, said third data comprising said indicating signal;

a first digital to analog converter for receiving said first data for generating said first analog signal of magnitude proportional to the magnitude of said first data; and a second digital to analog converter for receiving said second data and for generating said second analog signal of magnitude proportional to the magnitude of said second data.

18. The apparatus according to claim 16 wherein said signal selection and combining means comprises:

first multiplexing means, responsive to said indicating signal and having said first and second square wave signals as inputs, for providing said input first square wave signal as a first output signal when said indicating signal indicates said adjustable phase angle is within one of said first and fourth quadrants and for providing said input second square wave signal as the first output signal when said indicating signal indicates said adjustable phase angle is within one of said second and third quadrants;

second multiplexing means, responsive to said indicating signal and having said third and fourth square wave signals as inputs, for providing said input third square wave signal as a second output signal when said said indicating signal indicates said adjustable phase angle is within one of said first and second quadrants and for providing said input fourth square wave signal as said second output signal when said indicating signal indicates said adjustable phase angle is within one of said third and fourth quadrants; and means for combining said first and second output signals to produce said periodic fifth signal.

19. The apparatus according to claim 16 wherein said first means comprises:

first switch means responsive to said periodic reference signal for modulating said first analog signal to produce said first square wave signal, said first square wave signal being in phase with said periodic reference signal;

means for delaying said periodic reference signal by one half of its period, thereby producing a delayed periodic reference signal; and second switch means responsive to said delayed periodic reference signal for modulating said first analog signal to produce said second square wave signal, said second square wave signal being in phase with said delayed periodic reference signal.

* * * * *